(12) United States Patent
Kim

(10) Patent No.: US 9,748,315 B2
(45) Date of Patent: Aug. 29, 2017

(54) FLEXIBLE DISPLAY DEVICE AND METHOD OF FABRICATING THE SAME

(71) Applicant: LG DISPLAY CO., LTD., Seoul (KR)

(72) Inventor: TaeWoo Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/587,937

(22) Filed: Dec. 31, 2014

(65) Prior Publication Data

US 2016/0035801 A1 Feb. 4, 2016

(30) Foreign Application Priority Data

Aug. 4, 2014 (KR) ........................ 10-2014-0099996

(51) Int. Cl.
| | |
|---|---|
| *H01L 27/30* | (2006.01) |
| *H01L 51/00* | (2006.01) |
| *H01L 51/52* | (2006.01) |
| *H01L 51/56* | (2006.01) |
| *H01L 27/32* | (2006.01) |

(52) U.S. Cl.
CPC ........ *H01L 27/3244* (2013.01); *H01L 51/003* (2013.01); *H01L 51/0097* (2013.01); *H01L 51/5253* (2013.01); *H01L 51/5262* (2013.01); *H01L 51/56* (2013.01); *H01L 2227/323* (2013.01); *H01L 2227/326* (2013.01); *H01L 2251/303* (2013.01); *H01L 2251/5338* (2013.01); *H01L 2251/558* (2013.01); *Y02E 10/549* (2013.01); *Y02P 70/521* (2015.11)

(58) Field of Classification Search
CPC ............... H01L 51/0097; H01L 51/003; H01L 2251/5338; H01L 2227/326; H01L 27/1266; H01L 2221/68368
See application file for complete search history.

(56) References Cited

U.S. PATENT DOCUMENTS

| | | | | |
|---|---|---|---|---|
| 2004/0238827 | A1* | 12/2004 | Takayama | ........... H01L 27/1214 257/79 |
| 2006/0132025 | A1* | 6/2006 | Gao | ........................ H01L 51/52 313/503 |
| 2008/0042940 | A1* | 2/2008 | Hasegawa | ............... G02F 1/167 345/76 |
| 2009/0004772 | A1* | 1/2009 | Jinbo | ................ H01L 29/66969 438/99 |
| 2012/0020056 | A1 | 1/2012 | Yamagata et al. | |

(Continued)

FOREIGN PATENT DOCUMENTS

EP 1830336 A1 9/2007

*Primary Examiner* — Jerome Jackson, Jr.
*Assistant Examiner* — David Spalla
(74) *Attorney, Agent, or Firm* — Birch, Stewart, Kolasch & Birch, LLP

(57) ABSTRACT

A flexible display device including a substrate; a driving element layer including a plurality of thin film transistors on the substrate; a display element layer including organic light-emitting diodes electrically connected to the thin film transistors on the driving element layer; a light transmissive layer on the display element layer and configured to adjust a neutral plane of the flexible display device to lie at the driving element layer and the display element layer when the flexible display device is bent; and a back plate film attached to a back side of the substrate and having a cut portion formed in a center region where the flexible display device is bent.

10 Claims, 8 Drawing Sheets

(56) References Cited

U.S. PATENT DOCUMENTS

2012/0288685 A1    11/2012  Yukawa et al.
2013/0076268 A1    3/2013  Choi et al.
2015/0069333 A1*  3/2015  Bedell, III ......... H01L 27/1218
                                                                             257/40

* cited by examiner

FLEXIBLE DISPLAY DEVICE AND METHOD OF FABRICATING THE SAME

CROSS-REFERENCE TO RELATED APPLICATIONS

Pursuant to 35 U.S.C. §119(a), this application claims the benefit of earlier filing date and right of priority to Korean Application No. 10-2014-0099996, filed on Aug. 4, 2014, the contents of which is incorporated by reference herein in its entirety.

BACKGROUND OF THE INVENTION

1. Field of the Invention

The present invention relates to a flexible display device, and more particularly, to a flexible display device which can achieve reliability against repeated bending and minimize damage to a display panel by reducing whitening, and a method of fabricating the same.

2. Description of the Conventional Art

Flat panel display devices have reduced weight and volume compared to cathode ray tube display devices. Typical flat panel display devices include liquid crystal displays, field emission displays, plasma display panels, organic light-emitting diode displays (OLED displays), and the like.

Among them, the OLED display is a self-emissive display in which an organic light-emitting diode provided on a display panel has high luminance and low operating voltage characteristics and emits light by itself. Hence, the OLED display has a high contrast ratio and can be made super-thin. Also, the OLED display can easily implement moving images due to its short response time of several microseconds (μs), has an unlimited viewing angle, and is stable at a low temperature.

Numerous efforts for implementing a flexible display device have been made in recent years to fulfill a variety of purposes such as the ease of carrying it around, versatility in configuration, damage prevention, etc. For instance, a screen-bendable flexible display device can be implemented by making a liquid crystal display or an organic light-emitting diode display of a flexible substrate.

FIG. 1A is a view schematically showing a structure of a related art flexible display device, and FIG. 1B is a pattern diagram of the force applied to the display device when the flexible display device of FIG. 1A is bent. Referring to FIGS. 1A and 1B, the related art flexible display device includes a plastic substrate 2, a driving element layer 3 formed on the substrate 2, a protective film layer 7 including a protective film for protection of the underlying layer, and a polarizing film layer 8.

The plastic substrate 2 is a base substrate where a variety of display elements and electrode patterns for implementing a display device are formed. The driving element layer 3 includes signal lines, thin film transistors, etc., and a display element layer made up of organic light-emitting diodes formed over or under the driving element layer 3.

Further, the protective film layer 7 serves to prevent damage to the driving element layer 3 caused by moisture penetration from the outside or impact, and the polarizing film layer 8 serves to compensate optical characteristics of the display device. The flexible display device of this structure bends to some degree when bent in the Y-axis direction. As it bends, a tensile force is applied outward and a compressive force is applied inward. Accordingly, the protective film layer 7 and the polarizing film layer 8 undergo changes in physical properties. Thus, whitening occurs in which white spots are seen on the surfaces, and the driving element layer 3 will suffer from such problems as damage to the thin film transistors, disconnection of the signal lines, and so on.

SUMMARY OF THE INVENTION

Accordingly, one aspect of the present invention is to provide a flexible display device which eliminates whitening occurring on a protective film layer and a polarizing film layer upon bending, and minimizes damage to a driving element layer and a display element layer, and a method of fabricating the same.

To achieve these and other advantages and in accordance with the purpose of the present invention, as embodied and broadly described herein, the present invention provides in one aspect a flexible display device including a substrate; a driving element layer including a plurality of thin film transistors on the substrate; a display element layer including organic light-emitting diodes electrically connected to the thin film transistors on the driving element layer; a light transmissive layer on the display element layer and configured to adjust a neutral plane of the flexible display device to lie at the driving element layer and the display element layer when the flexible display device is bent; and a back plate film attached to a back side of the substrate and having a cut portion formed in a center region where the flexible display device is bent. The present invention also provides a corresponding method of manufacturing the flexible display device.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments and together with the description serve to explain the principles of the invention.

In the drawings.

DETAILED DESCRIPTION OF THE INVENTION

Figure 1A:
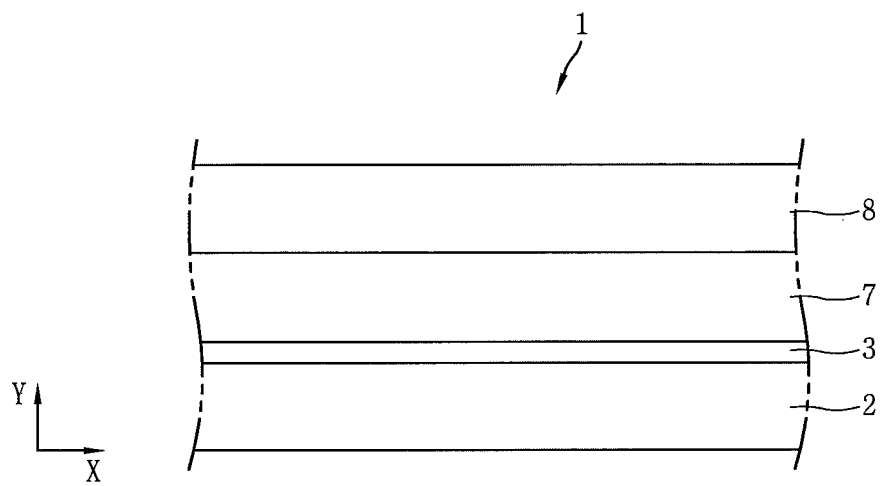
FIG. 1A is a view schematically showing a structure of a related art flexible display device.
Figure 1B:
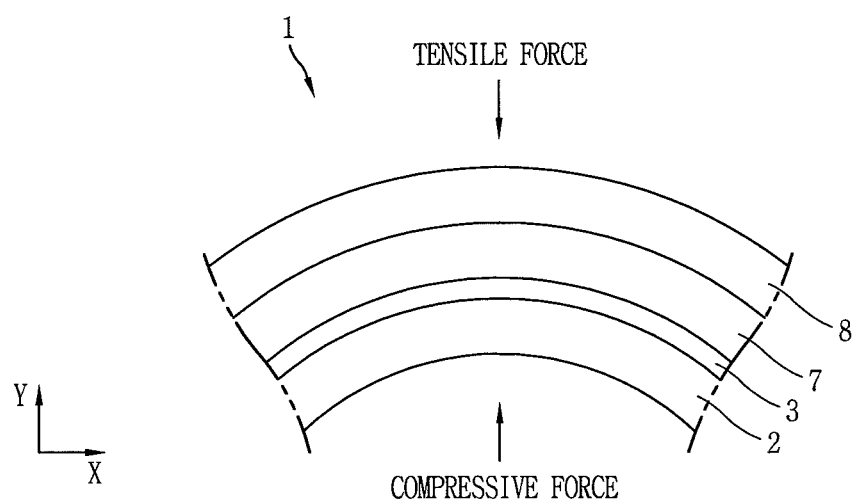
FIG. 1B is a pattern diagram of the force applied to the display device when the flexible display device of FIG. 1A is bent.

Advantages and features of the present invention and a method of accomplishing them can be understood more readily by reference to the following detailed description of embodiments and the accompanying drawings. The present invention may, however, be embodied in many different forms and should not be construed as being limited to the embodiments set forth herein. Rather, these embodiments are provided so that this invention will be thorough and complete and will fully convey the concept of the invention to those skilled in the art, and the present invention will only be defined by the appended claims.

Throughout the specification, like reference numerals indicate like parts. When terms "include," "have," "consist of," etc. are used, the relevant subject may include other parts unless the term "only" is used to define the contents thereof. As used herein, the singular forms "a", "an" and "the" are intended to include the plural forms as well, unless otherwise stated.

When the position relation between two parts is described using terms like "on", "above", "below", "next to" etc., one or more parts may be positioned between the two parts as long as the term 'immediately' or 'directly' is not used. When temporal relations are described using terms like "after", "subsequent to", "next", "before", etc., these terms do not limit temporal positions.

Although the terms first, second, third, etc. may be used herein to describe various elements, these elements should not be limited by these terms. These terms are used to distinguish one element from another. Thus, a first element discussed below could be termed a second element without departing from the scope of the present invention. Respective features of various embodiments of the present invention can be joined or combined with each other partly or wholly, various ways of interworking or driving can be technologically achieved, and the respective embodiments can be executed independently from each other or in conjunction with each other.

Hereinafter, a flexible display device and a method of fabricating the same according to a preferred embodiment of the present invention will be described with reference to the drawings. In particular, FIG. 2 is a view showing a structure of a flexible display device according to an embodiment of the present invention.

Figure 2:
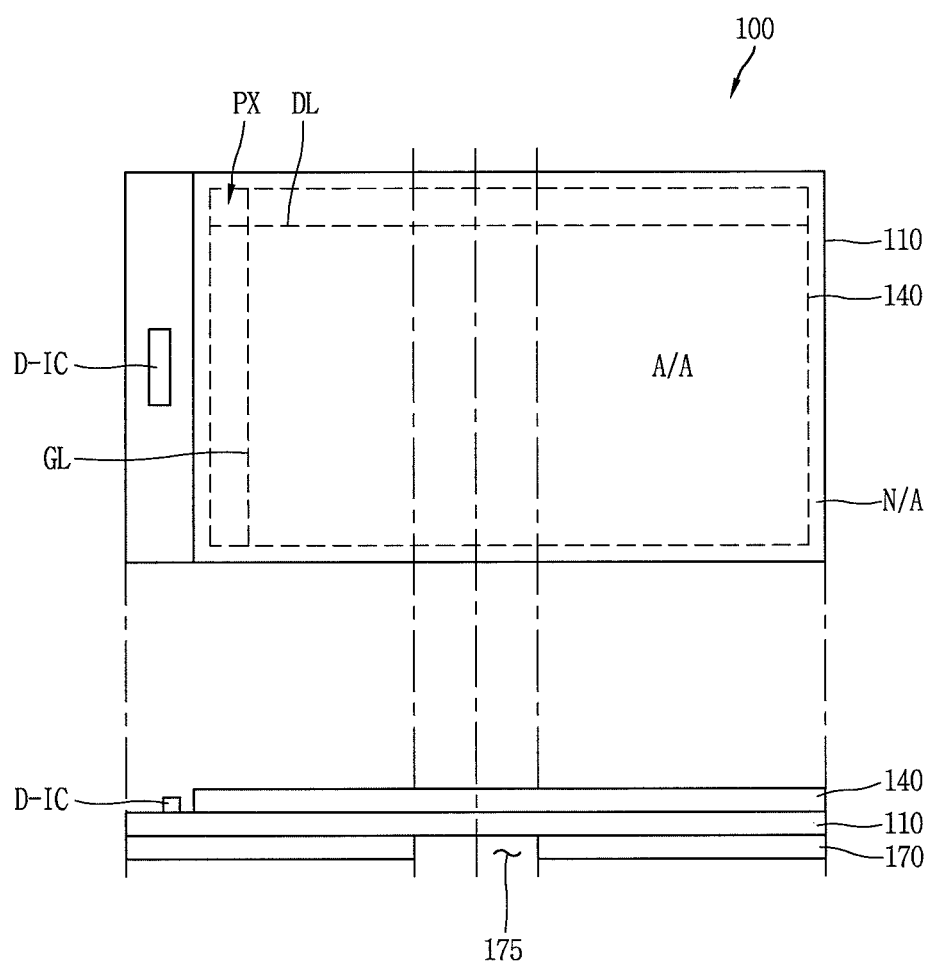
FIG. 2 is a view showing a structure of a flexible display device according to an embodiment of the present invention.

Referring to FIG. 2, the flexible display device includes a display panel 100 where an active area A/A displaying an image on a flexible substrate 110 and a non-active area N/A externally surrounding the active area externally surrounding the active area A/A are defined, and a driving IC D-IC mounted on one side of the display panel 100.

A plurality of gate lines GL and data lines DL are formed to cross each other in the active area A/A of the display panel 100, and a plurality of pixels PX each including at least one thin film transistor and an organic light-emitting diode are formed at the crossing points. In addition, a variety of signal lines are formed to be vertical or horizontal to the lines GL and DL. The signal lines and the thin film transistors constitute a driving element layer on the substrate, and the organic light-emitting diodes constitute a display element layer.

A gate driving circuit having a GIP (gate in panel) structure that is electrically connected to the pixels PX and supplies a gate signal may be mounted in the non-active area N/A of the display panel 100. The driving IC D-IC that supplies a variety of signals for driving, including a data signal, is mounted in the non-active area A/A on one side edge of the display panel 100. The substrate 110 of the display panel 100 may be made of a plastic material which is flexible so as to make the display device maintain its display performance even when bent like a piece of paper.

A light transmissive layer 140 is formed over the entire surface of the substrate 110, and prevents damage to the driving element layer and display element layer formed on the substrate 110 when the display panel 100 is bent. The light transmissive layer 140 emits light from the display element layer substantially without loss, and also adjusts the position of a neutral plane of the display panel 100 to correspond to the driving element layer and the display element layer, in order to minimize the tensile or compressive force applied to the driving element layer and the display element layer as the display panel 100 is bent. Accordingly, the material and thickness of the light transmissive layer 140 are determined so the neutral plane of the display panel 100 lies at the driving element layer and the display element layer, corresponding to the substrate 110. That is, the light transmissive layer 140 is formed so it has the same Young's modulus as the substrate 100.

The neutral plane is defined as a plane where the compressive force and tensile force generated in a bent portion formed by bending the display panel 100 are the smallest. The compressive force and tensile force are the largest on both surfaces of the display panel 100, gradually get smaller toward the inside, and are the smallest at the center. In an example, when two substrates having the same physical properties are attached together, the neutral plane is formed at the point of attachment of the two substrates; and two substrates having different physical properties are attached together, the neutral plane is located away from the center depending on their physical properties If the light transmissive layer 140 is omitted from the display panel 100 of FIG. 2, for example, either the compressive or tensile force caused by bending is maximally applied to the driving element layer and display element layer located on the surface of the substrate 110, thus causing damage. Accordingly, the light transmissive layer 140 is provided on the entire surface of the substrate 110 including the driving element layer and the display element layer in a way that corresponds to the physical properties of the substrate 110, so that the neutral plane is formed at the driving element layer and the display element layer to make the compressive and tensile forces caused by bending as small as possible. Therefore, according to the embodiment of the present invention, damage to the driving element layer and the display element layer can be avoided.

As the light transmissive layer 140 is located on the outermost part of the display panel 100, a thin hard-coating film is formed on the light transmissive layer 140 so as to offer resistance to scratches from outside forces. A plate film 170 is attached on the back side of the substrate 110 to maintain the overall rigidity of the display panel 100. The plate film 170 has a cut portion 175 formed by cutting the center region of the display panel 100 in one direction.

The cut portion 175 is formed by removing a portion at which bending occurs, in order to overcome difficulties in application of the plate film 170 which occur as the plate film 170 is bent into an unintended shape due to its flexibility and in order to make the display panel 100 bend well in an intended shape. Accordingly, the plate film 170 keeps the outer region of the display panel 100 from hanging down, and at the same time allows the center region of the display panel 100 to easily bend upward and downward by external force.

Figure 3:
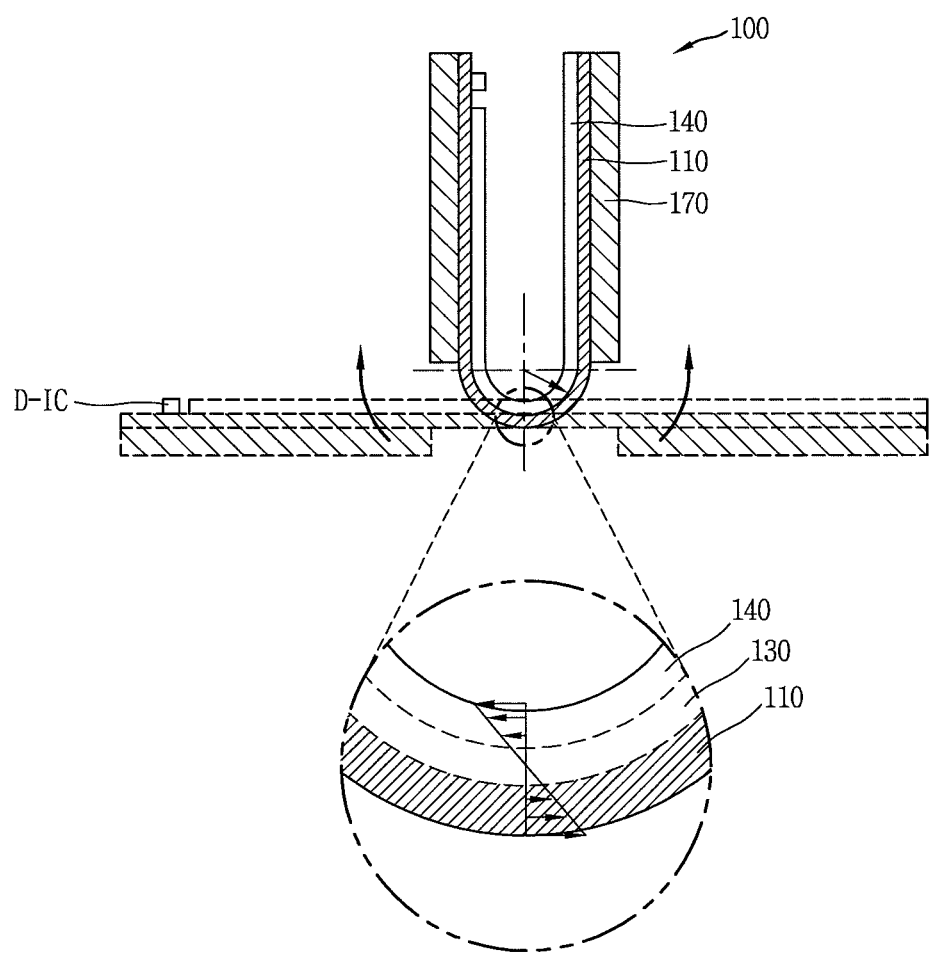
FIG. 3 is a view illustrating a shape the display panel of FIG. 2.

FIG. 3 is a view illustrating a shape of the display panel 100 of FIG. 2. In particular, FIG. 3 illustrates an example in which, as the cut portion 175 of the plate film 170 is formed in the center region of the display panel 100, both sides of the display panel 100 are bent forward with respect to the cut portion 175 into a U-shape. A display element layer 130 is also formed on the substrate 110.

The force acting on the display panel 100 due to bending is concentrated in the center region, a compressive force acts inward from the bend, a tensile force acts outward from the bend, and a neutral plane is formed at a boundary between the regions of compression and tension where the two forces are in equilibrium. Accordingly, the compressive force becomes maximum on the light transmissive layer 140 located on the upper outermost part of the display panel 100, and the tension becomes maximum on the substrate 110.

The light transmissive layer 140 may have a thickness of 20 μm to 50 μm, taking the neutral plane into consideration. The light transmissive layer 140 has a hard-coating layer formed on the surface so as to minimize whitening by changes in the physical properties caused by the compressive force or tensile force. The hard-coating layer is made of an inorganic film, for example, silicon dioxide $SiO_2$.

Figure 4:
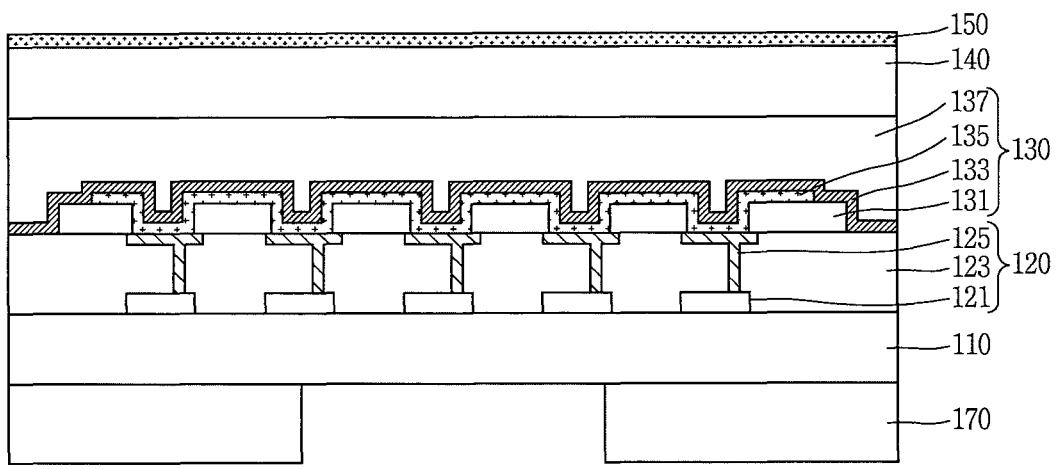
FIG. 4 is a view showing in detail a cross-section structure of part of the display panel of the flexible display device according to the embodiment of the present invention.

FIG. 4 is a view showing in detail a cross-section structure of part of the display panel of the flexible display device according to the embodiment of the present invention. Referring to FIG. 4, the display panel of the flexible display device includes a substrate 110, a driving element layer 120 and a display element layer 130 formed on the substrate 110, a light transmissive layer 140 formed on the display element layer 130 and defining the driving element layer 120 and the display element layer 130 as a neutral plane, and a back plate film 170 attached to the back side of the substrate 110 and having a cut portion in the center region.

The light transmissive layer 140 is hard-coated with an inorganic film; that is, it has a hard-coating layer 150 formed on the surface. More specifically, the substrate 110 may be made of polyimide PI, and a back plate film 170 made of polyethylene terephthalate (PET) or transparent polycarbonate (PC) is attached to the back side.

A plurality of gate lines and data lines and a driving element layer 120 including thin film transistors 121 connected to the gate lines and the data lines, an interlayer insulating film 123, and first electrodes 125 connected to the thin film transistors 121 are formed on the substrate 110.

A display element layer 130 is formed on the driving element layer 120, and includes banks 131 for separating the pixels, organic light-emitting diodes, each using a first electrode 125 as the anode and made up of a second electrode 133 as the cathode and an emissive layer 135 interposed between the first electrode 125 and the second electrodes 133, and a protective layer 137 sealing the organic light-emitting diodes The light transmissive layer 140 is formed on the display element layer 130, uses the driving element layer and the display element layer as a neutral plane, prevents damage upon bending, and allows light emitted from the organic light-emitting diodes to pass forward with the surface. The hard-coating layer 150 is formed on the surface of the light transmissive layer 140 to prevent scratching.

According to this structure, the center region of the flexible display device is easily bent as the back plate film 170 has a cut portion, the light transmissive layer 140 minimizes damage to the driving element layer 120 and display element layer 130 caused by bending, and no whitening occurs.

Hereinafter, a method of fabricating a flexible display device according to an embodiment of the present invention will be described with reference to the drawings. In particular, FIGS. 5A to 5G are views showing a method of fabricating a flexible display device according to an embodiment of the present invention.

Referring to FIGS. 5A to 5G, the method of fabricating a flexible display device according to the embodiment of the present invention includes forming a substrate on carrier glass; forming, on the substrate, a driving element layer including a plurality of thin film transistors; forming, on the driving element layer, a display element layer including organic light-emitting diodes electrically connected to the thin film transistors; fixating, on the display element layer, a light transmissive layer defining the driving element layer and the display element layer as a neutral plane; attaching a protective film onto the light transmissive layer; removing the carrier glass and attaching a back plate film onto the back side of the substrate; and forming a cut portion by cutting a given region of the back plate film and removing the protective film.

Figure 5A:
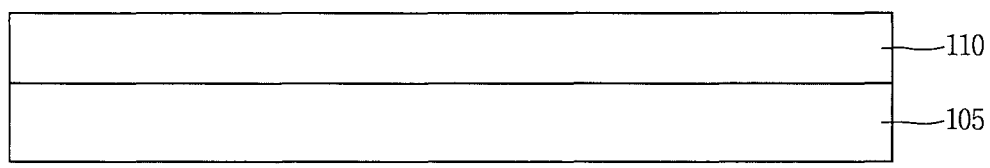
FIGS. 5A to 5G are views showing a method of fabricating a flexible display device according to an embodiment of the present invention.

Referring to FIG. 5A, in the method of fabricating a display panel of the flexible display device according to an embodiment of the present invention, a fabrication process is performed on carrier glass 105 in order to minimize defects caused by the flexibility of the substrate 110 during fabrication. First of all, carrier glass is prepared, and a substrate 110 is formed on the glass by using polyimide.

Figure 5B:
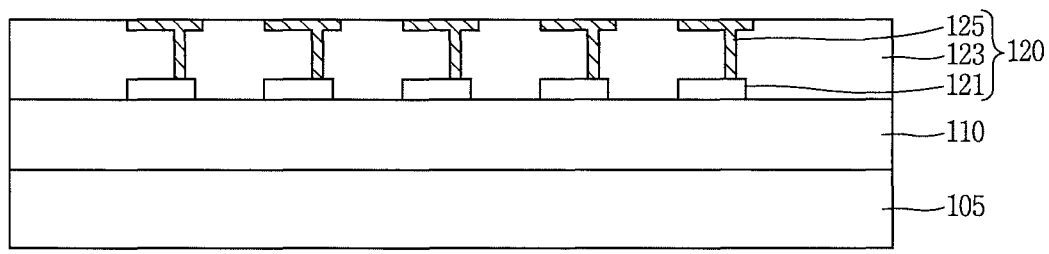

Next, referring to FIG. 5B, a driving element layer 120 including a plurality of thin film transistors is formed on the substrate 110. A process of forming the driving element layer will be described in detail. A plurality of TFTs are formed by performing a predetermined thin film transistor (TFT) process on the substrate 110. First, an active layer made of hydrogenated amorphous silicon, polycrystalline silicon, or oxide semiconductor is formed on the substrate 110.

Subsequently, a gate insulating film made of silicon nitride SiNx or silicon dioxide $SiO^2$ is formed on the substrate 110 including the active layer, and then gate electrodes and gate lines are formed on the gate insulating film. Afterwards, an insulating film made of silicon nitride or silicon dioxide is formed on the gate electrodes and the gate lines. Next, data lines, other driving voltage lines, and source and drain electrodes are formed to constitute thin film transistors 121. Afterwards, an interlayer insulating film 123 is formed over the entire surface of the substrate 110.

After forming the interlayer insulating film 123, first electrodes 125 connected to the drain electrodes of the TFTs 121 are formed. The first electrodes 125 may serve as the anodes of the organic light-emitting diodes and may be reflective. Accordingly, the TFTs 121, the interlayer insulating film 123, and the first electrodes 125 constitute the driving element layer 120.

Figure 5C:
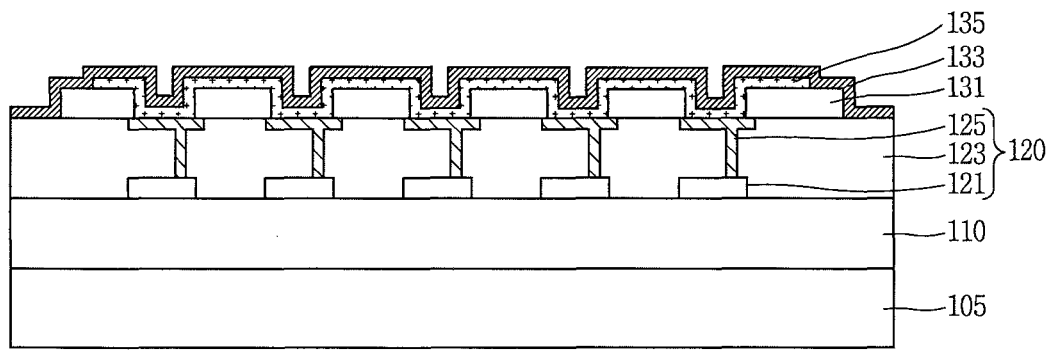

Next, referring to FIG. 5C, banks 131 made of an insulating material, for example, benzocyclobutene (BCB), polyimide, or photoacryl are formed on the entire surface of the driving element layer 120. The banks 131 overlap the edges of the first electrodes 125 in a manner that surrounds each pixel as viewed from above, and has a grid-like structure having a plurality of openings when seeing the display panel as a whole.

An emissive layer 135 is formed on the banks 131 and the portions of the first electrodes 125 exposed by the banks 131. The emissive layer 135 may be made of a material that emits red, green, blue, and white light, which may be a phosphorescent or fluorescent material. Especially, the emissive layer 135 may further include an electron transport layer, a hole transport layer, an electron injection layer, and a hole injection layer, and the arrangement and structure of the emissive layer 135 may be implemented in various forms as intended by the designer.

Next, a conductive material is deposited on the entire surface of the substrate 100 including the emissive layer 135 to form second electrodes 133. The second electrodes 133 are made of a material with such a thickness as to allow light transmission therethrough, which may be a transparent conductive material such as ITO, IZO, etc.

Accordingly, the first electrodes 125 and the second electrodes 133 serve as anodes and cathodes, and constitute organic light-emitting diodes that emit light through the emissive layer 135. In addition, if the flexible display device includes a touch function, touch electrodes for sensing touch may be formed, along with the lines and electrodes of the driving element layer or display element layer.

Figure 5D:
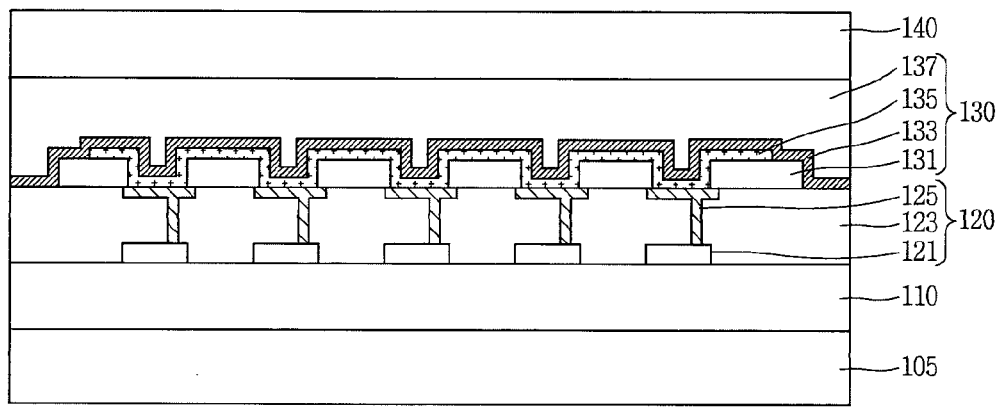

Subsequently, referring to FIG. 5D, a protective layer 137 is formed as a sealing structure on the substrate 110 with the second electrodes 133 on it. The protective layer 137 may have a multi-layer structure, rather than a single layer film. In an example, the protective film 137 may be formed by sequentially laminating a first protective film, an organic film, and a second protective film.

The organic film may be made of an organic material such as polymer, and examples of the organic film include olefin polymer, PET, epoxy resin, fluorine resin, and polysiloxane. The first protective film and the second protective film may be made of an inorganic insulating film such as silicon nitride or silicon dioxide. Especially, if the protective layer 137 further includes a polarizing film, the related art polarizing film attached to the outside can be omitted. This reduces manufacturing costs by structure simplification and make bending easier as the film is omitted.

Such a structure is called a face seal structure, which effectively prevents moisture penetration from the outside. Other structures than this structure may be applied according to the design intent. In addition, once the display element layer 130 is formed, a driving IC mounting process may be performed on one side of the substrate 110.

Subsequently, when the display element layer 130 is formed through the above procedure, a light transmissive layer 140 defining the driving element layer 120 and the display element layer 130 as a neutral plane is formed on the display element layer 130. The light transmissive layer 140 must be produced by a low-temperature process of 100° C. or less so as to avoid thermal damage to the underlying display element layer 130. Specifically, a method of fabricating a desirable light transmissive layer 140 will be described. First, a coating solution of polyimide (PI) dissolved in a solvent with a boiling point below 100° C. is prepared, and the coating solution is applied over the entire surface of the substrate 110 by a slit coating method.

Subsequently, the substrate coated with the polyimide solution is put into a pre-heated chamber, air is pumped into the chamber to harden the coating solution at a pressure not greater than a given pressure, and then the substrate 110 is taken out of the chamber, thereby forming the light transmissive layer 140. The temperature in the chamber recommended for this process ranges from 60° C. to 80° C., and the pressure in the chamber is about 0.1 Torr. The light transmissive layer 140 have a thickness of 20 μm to 50 μm, taking the neutral plane into consideration.

Figure 6:
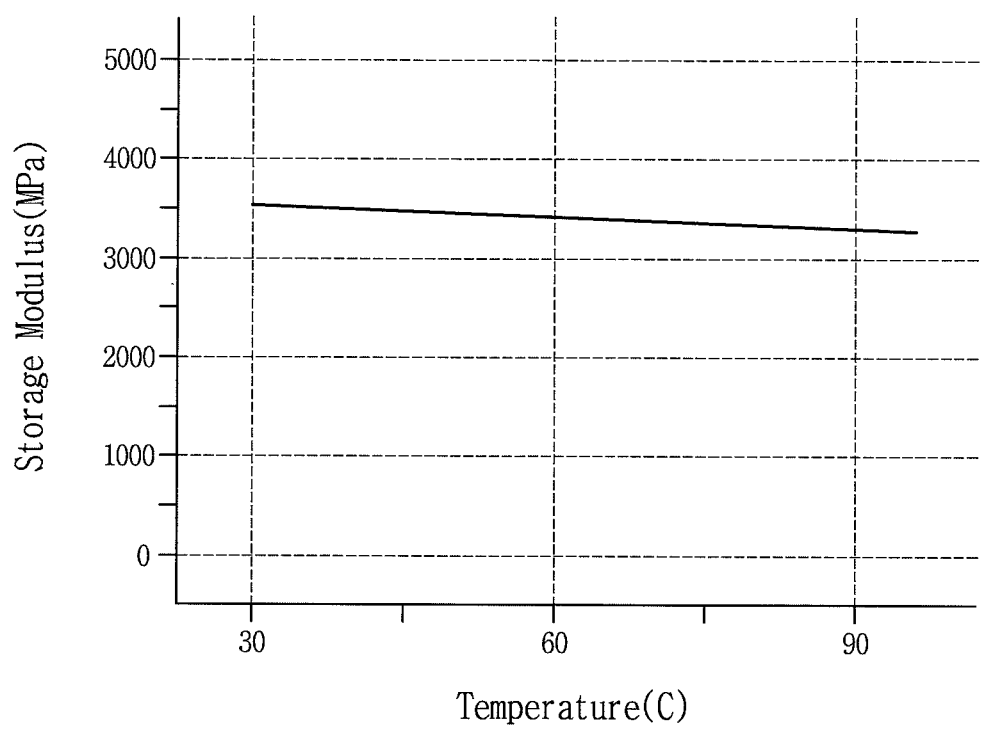
FIG. 6 is a graph showing the modulus of elasticity versus temperature of polyimide (PI) used in this process.

FIG. 6 is a graph showing the modulus of elasticity versus temperature of polyimide (PI) used in this process. According to the low-temperature process, the storage modulus of the polyimide (PI) must be in the range from 3,000 Mpa to 4,000 Mpa.

Figure 5E:
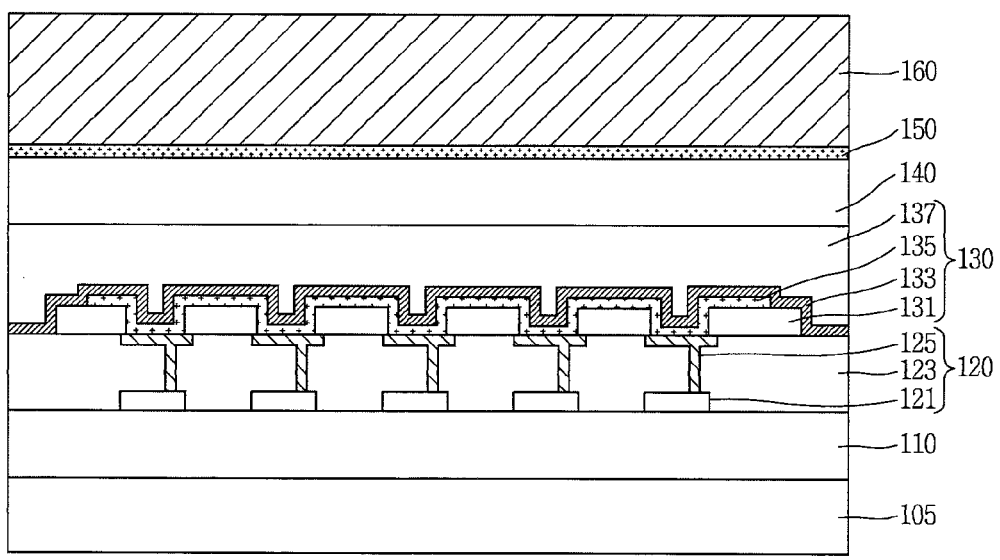

The light transmissive layer 140 produced by the above-stated method protects the driving element layer and the display element layer as a neutral plane and is formed at the two element layers, and the above temperature and pressure conditions and the characteristics of the raw material, i.e., polyimide, help to prevent damage to the light transmissive layer 140 due to a compressive force or tensile force. However, even if the light transmissive layer 140 itself is resistant to compression or tension, it is not resistant to scratches from outside forces. In the embodiment of the present invention, as shown in FIG. 5E, the surface of the light transmissive layer 140 is hard-coated in order to increase the rigidity of the light transmissive layer 140 against physical external forces.

The hard-coating layer 150 formed by surface treatment of the light transmissive layer 140 contributes to minimize whitening caused by external forces. The hard-coating layer is made of an inorganic film, for example, silicon dioxide $SiO^2$. The display panel fabricated by this process is thin, which makes it difficult to perform the subsequent processes. Accordingly, a removable protective film 160 is attached to the surface-treated light transmissive layer 140, that is, the hard-coating layer 150.

Figure 5F:
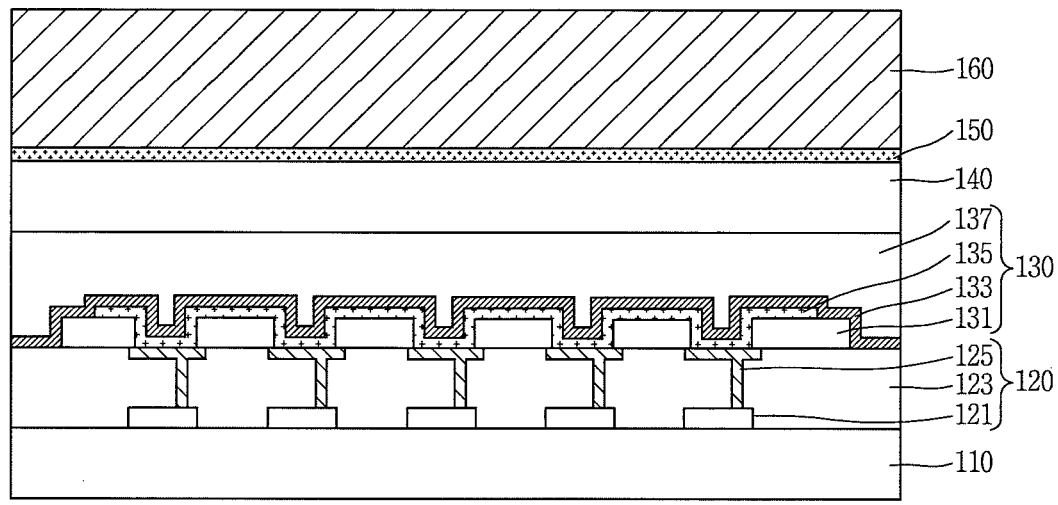

Next, as shown in FIG. 5F, the carrier glass (105 of FIG. 5E) located on the back side of the substrate 110 is removed. Subsequently, a back plate film for maintaining the flatness of the display panel is attached to the back side of the substrate 110 from which the carrier glass has been removed. The back plate film may be made of a material such as polyethylene terephthalate (PET) or transparent polycarbonate (PC).

Figure 5G:
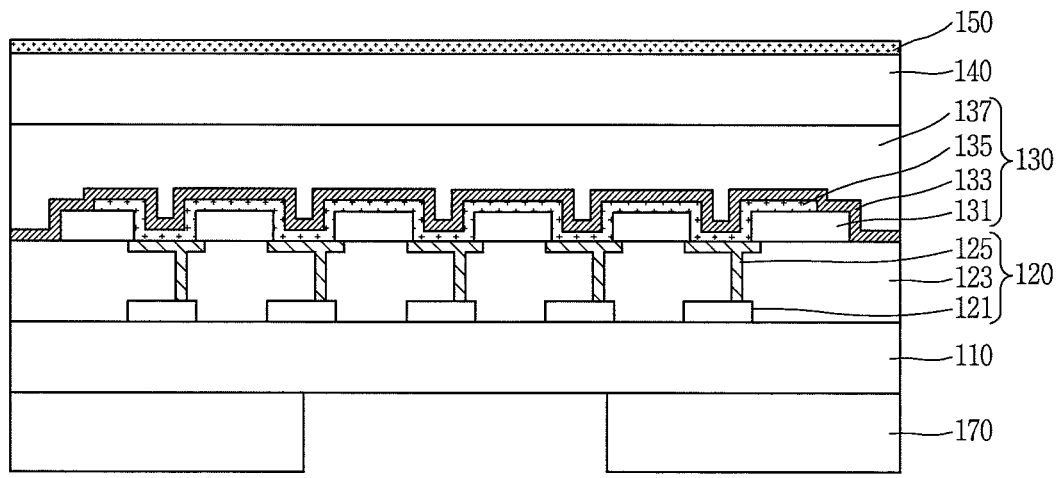

Although the back plate film can maintain the flatness of the display panel, it weakens the flexibility of the display panel. Thus, as shown in FIG. 5G, a back plate film 170 for maintaining flatness is provided on the back side of the substrate 110, with a cut portion formed by cutting the center region of the display panel which is expected to be bent, and the protective film (160 of FIG. 5F) attached on the light transmissive layer 140 is removed, thereby completing the fabrication process of the display panel.

The flexible display device fabricated according to the above-described fabrication method minimizes damage to the driving element layer and display element layer of the display panel caused by bending and reduces whitening.

Although many details have been set forth in the foregoing description, these details do not limit the scope of the present invention but should be construed as of the preferred embodiment. Thus, the scope of the present invention is not determined by the embodiments but by the claims and their equivalents.

What is claimed is:

1. A method of fabricating a flexible display device, the method comprising:
    forming a substrate on a carrier glass;
    forming, on the substrate, a driving element layer including a plurality of thin film transistors;
    forming, on the driving element layer, a display element layer including organic light-emitting diodes electrically connected to the thin film transistors;
    forming a light transmissive layer on the display element layer to adjust a neutral plane of the flexible display device to lie at the driving element layer and the display element layer when the flexible display device is bent;

attaching a removable protective film onto the light transmissive layer;

removing the carrier glass and attaching a back plate film onto a back side of the substrate; and forming a cut portion by cutting a given region of the back plate film in a region where the flexible display device is expected to be bent and removing the protective film, wherein the forming the light transmissive layer comprises:

preparing a coating solution dissolved in a solvent with a boiling point of 100° C. or less;

applying the coating solution over the entire surface of the substrate;

placing the substrate coated with the coating solution into a pre-heated chamber;

pumping air into the heated chamber to harden the coating solution at a pressure not greater than a given pressure; and removing the substrate from the heated chamber.

2. The method of claim 1, wherein the coating solution is a solution of polyimide PI dissolved in a solvent with a boiling point of 100° C. or less and the coating solution is applied over the entire surface of the substrate by a slit coating method.

3. The method of claim 2, wherein the coating solution is applied at a thickness from 20 μm to 50 μm.

4. The method of claim 2, further comprising:
pre-heating the chamber to a temperature between 60° C. and 80° C.

5. The method of claim 1, wherein the light transmissive layer has a same Young's modulus as the substrate.

6. The method of claim 1, wherein the neutral plane is defined as a plane where a compressive force and tensile force generated in a bent portion formed by bending the flexible display device are the smallest.

7. The method of claim 6, wherein the compressive force and tensile force are the largest on both surfaces of the flexible display device, gradually get smaller toward the inside, and are the smallest at the center.

8. The method of claim 7, wherein the light transmissive layer and the substrate have the same physical properties so the neutral plane is formed at the driving element layer and the display element layer to make the compressive and tensile forces caused by bending smaller.

9. The method of claim 1, wherein the back plate film includes a material configured to maintain an overall rigidity of the flexible display device.

10. The method of claim 1, wherein the back plate film supports outer regions of the flexible display device while the cut portion formed in the region of the back plate film allows the region of the flexible display device to bend upward and downward by an external force.

* * * * *